(12) United States Patent
Paclibon et al.

(10) Patent No.: US 9,618,565 B2
(45) Date of Patent: Apr. 11, 2017

(54) TESTING RESONANT SENSOR CIRCUITS USING SIGNAL SOURCES AND CONTROLLABLE RESISTORS

(71) Applicant: Texas Instruments Incorporated, Dallas, TX (US)

(72) Inventors: Frederick Paclibon, Cupertino, CA (US); George P. Reitsma, Redwood City, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 209 days.

(21) Appl. No.: 14/611,752

(22) Filed: Feb. 2, 2015

(65) Prior Publication Data

US 2016/0223607 A1 Aug. 4, 2016

(51) Int. Cl.
*G01R 31/28* (2006.01)
*G01R 23/02* (2006.01)
*G01R 27/28* (2006.01)
*G01R 27/26* (2006.01)

(52) U.S. Cl.
CPC ......... *G01R 31/2829* (2013.01); *G01R 27/28* (2013.01); *G01R 27/26* (2013.01); *G01R 31/2824* (2013.01)

(58) Field of Classification Search
CPC  G01R 31/2829; G01R 27/28; G01R 31/2824; G01R 27/26

USPC ......................................................... 324/619
See application file for complete search history.

(56) References Cited

U.S. PATENT DOCUMENTS 5,646,541 A * 7/1997 Ninomiya .......... G01R 31/2824
324/617

* cited by examiner

*Primary Examiner* — Billy Lactaoen
(74) *Attorney, Agent, or Firm* — Andrew Viger; Charles A. Brill; Frank D. Cimino

(57) ABSTRACT

A test system (and methodology) suitable for testing a resonant sensor circuit configured to drive a sensor resonator with a negative resistance. Example embodiments include a test sensor resonator setup configured to simulate a sensor resonator with a selectable loss factor Rs, and includes, in a single-ended configuration, a first oscillator signal source that generates a first oscillation signal, coupled to a first controllable resistor that provides a controlled resistance R1 that simulates a selectable sensor resonator loss factor Rs, which together generate a first oscillation voltage signal based on the controlled resistance R1. A DUT resonant sensor circuit is coupled to receive the first oscillation voltage signal at a first input, and generate a negative resistance −Ra that substantially counterbalances the resistance R1 (corresponding to sustained oscillation). A differential configuration includes first and second oscillator signal sources, coupled to first and second controllable resistors R1 and R2.

18 Claims, 1 Drawing Sheet

TESTING RESONANT SENSOR CIRCUITS USING SIGNAL SOURCES AND CONTROLLABLE RESISTORS

BACKGROUND

Technical Field

This Patent Document relates generally to resonant sensing, and more particularly to testing resonant sensor circuits, such as resonant inductive sensor circuits.

Related Art

Resonant sensing systems include a sensor resonator and sensor electronics (resonant sensor circuit).

A sensor resonator includes a resonator configured for operation in a resonance state (resonant frequency and amplitude). The sensor electronics drives the resonator with an AC excitation current synchronized with resonator oscillation voltage to maintain resonance (sustained, steady-state oscillation), balancing a resonator loss factor represented by a resonator impedance.

Resonant sensing is based on changes in resonance state manifested by changes in resonator oscillation amplitude and frequency resulting from changes in resonator impedance, for example in response to a conductive target. That is, sensor response to a conductive target is manifested as a change in resonator impedance (loss factor); so that corresponding changes in resonator current drive to balance the change in resonator impedance, and sustain resonance oscillation, represent a sensed condition of the target (such as proximity, position or physical state).

An example of resonant sensing is resonant inductive sensing that uses a sensor resonator implemented as an LC tank circuit with a sensing coil inductor, and a resonator loss factor (which can be represented as a series resistance Rs). The sensor LC resonator, operated at resonance, projects a magnetic sensing field (magnetic flux energy). A conductive target interacts with the projected magnetic sensing field (and the coil inductor) based on the eddy current effect, so that sensor resonance is affected by a storage or loss in magnetic flux energy output from the sensing coil inductor, which corresponds to a change in resonator loss factor.

BRIEF SUMMARY

This Brief Summary is provided as a general introduction to the Disclosure provided by the Detailed Description and Drawings, summarizing some aspects and features of the Disclosure. It is not a complete overview of the Disclosure, and should not be interpreted as identifying key elements or features of the invention, or otherwise characterizing or delimiting the scope of the invention disclosed in this Patent Document.

The Disclosure describes apparatus and methods for testing a resonant sensor circuit configured for operation with a sensor resonator characterized by a loss factor Rs, where the resonant sensor circuit is configured to monitor resonator oscillation voltage, and to drive the sensor resonator with a negative resistance controlled to sustain resonator oscillation.

According to aspects of the Disclosure, the methodology for testing a resonant sensor circuit can include: (a) generating a first oscillation voltage signal with a first oscillator signal source, coupled to a first controllable resistor that provides a controlled resistance R1 that simulates a selectable sensor resonator loss factor Rs, thereby simulating a sensor resonator with a selectable loss factor Rs; (b) receiving the first oscillation voltage signal at a first input to a device-under-test (DUT) resonant sensor circuit; and (c) operating the DUT resonant sensor circuit to generate, in response to the first oscillation voltage signal, a negative resistance −Ra that substantially counterbalances the resistance R1 corresponding to a state of sustained oscillation at the first input to the DUT resonant sensor circuit.

According to other aspects of the Disclosure, the DUT resonant sensor circuit can be configured for differential input, and the testing methodology can further include generating a second oscillation voltage signal with a second oscillator signal source that is anti-phase to the first oscillation signal source, and a second controllable resistor that provides a controlled resistance R2 that simulates the selectable sensor resonator loss factor Rs. The first and second anti-phase oscillator signal sources and controlled resistances R1 and R2 generate differential first and second oscillation voltage signals at differential first and second inputs to the DUT resonant sensor circuit, and the DUT resonant sensor circuit generates, in response to the differential first and second oscillation voltage signals, the negative resistance −Ra that substantially counterbalances the resistances R1 and R2.

Other aspects and features of the invention claimed in this Patent Document will be apparent to those skilled in the art from the following Disclosure.

DETAILED DESCRIPTION

Figure 1:
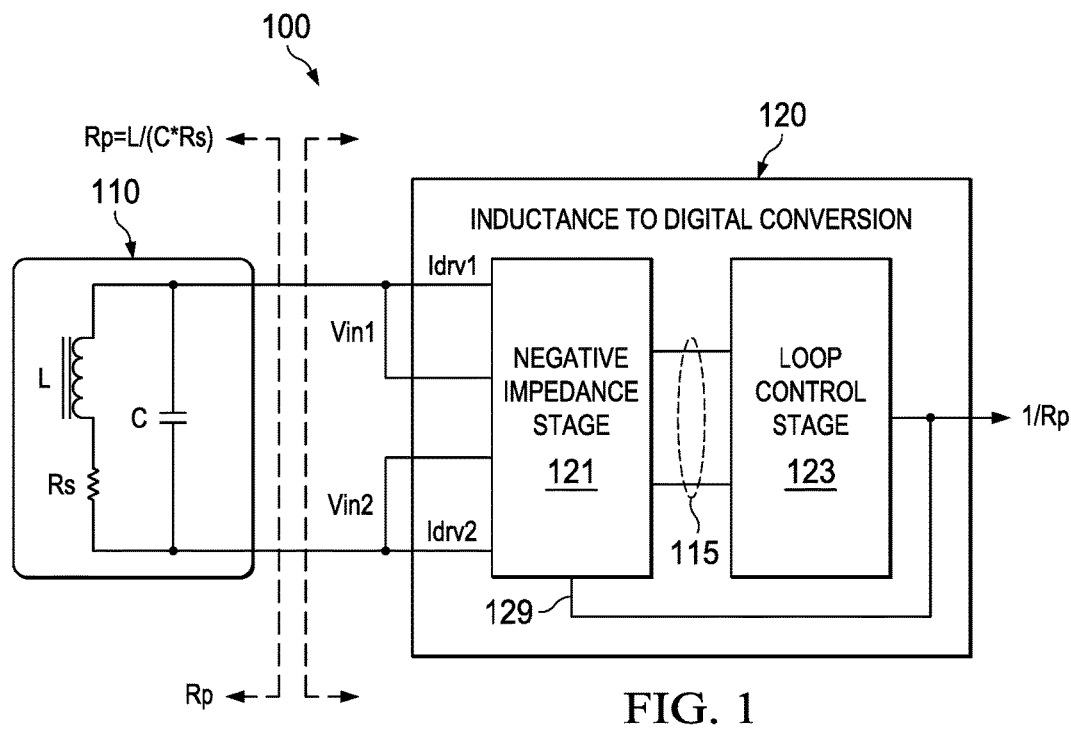
FIG. 1 illustrates an example embodiment of a resonant inductive sensor system that includes an LC resonator 110 (with loss factor Rs), driven by an inductance-to-digital (IDC) conversion unit 120 (resonant sensor circuit) that includes a negative impedance stage 121 driving excitation current with a negative impedance, and a loop control stage 123 that provides a feedback loop control signal 129 that controls negative impedance to counterbalance the resonator loss factor (Rs) for sustained oscillation.

This Description and the Drawings constitute a Disclosure of example embodiments and applications that illustrate various features and advantages of apparatus and methods for testing resonant sensor circuits (sensor electronics) using signal sources and controllable resistors.

In an example application, a resonant sensor circuit is designed for use in an example resonant sensing system, including the resonant sensor circuit coupled to a sensor resonator, forming a sensor, and a conductive target.

In an example embodiment, the resonant sensor circuit is designed for use in a resonant inductive sensing system; with a sensor resonator implemented as an LC tank circuit including a coil inductor. The resonant sensor circuit is implemented as an inductance-to-digital conversion (IDC) circuit configured to drive a sensor resonator, and to acquire sensor measurements/readings that can be converted to sensor data output (samples) by the IDC, such as for processing as target position information.

Typically, a resonant sensor circuit, such as the example IDC, is fabricated separately from the sensor resonator. The sensing system designer/assembler combines the resonant sensor circuit with a sensor resonator and a target. The sensor resonator is constructed for operation with the IDC.

Production test for the resonant sensor circuit, such as the example IDC, requires operation with a test sensor resonator in order to characterize IDC parameters such as IDC negative impedance response to a particular sensor resonator impedance (i.e., corresponding to a response to a target), required to sustain resonance oscillation. Production test of the IDC driving a test sensor resonator (LC tank circuit) involves problems that include: resonance impedance of a sensor resonator is subject to inductor tolerances and temperature drift, startup can be long, and in case of multi-site testing, cross-talk (interlocking) can occur between sensor resonators. In particular, resonance impedance (resonator impedance at resonance), is affected by inductor tolerances and temperature drift. For example, a typical inductor has 5% tolerance and a temperature drift of 0.4% per degree C., or in the range of 4 bits of drift per degree C. (in comparison to a typical IDC resolution of 10 to 12 bits). Both tolerance and temperature drift make precision characterization in a multi-side setup problematic.

In brief overview, the Disclosed test system (and methodology) is suitable for testing a resonant sensor circuit configured for operation with a sensor resonator characterized by a loss factor Rs, where the resonant sensor circuit is configured to monitor resonator oscillation voltage, and to drive the sensor resonator with a negative resistance controlled to sustain resonator oscillation. Example embodiments of the test system include a test sensor resonator setup, and a device-under-test (DUT) resonant sensor circuit. The test sensor resonator setup is configured to simulate a sensor resonator with a selectable loss factor Rs, and includes a first oscillator signal source that generates a first oscillation signal, coupled to a first controllable resistor that provides a controlled resistance R1 that simulates a selectable sensor resonator loss factor Rs. The first oscillator signal source and the first controllable resistor are configured to generate a first oscillation voltage signal based on the controlled resistance R1. The DUT resonant sensor circuit is coupled to receive the first oscillation voltage signal at a first input, and is configured to generate, in response to the first oscillation voltage signal, a negative resistance −Ra that substantially counterbalances the resistance R1 corresponding to a state of sustained oscillation at the first input.

In other example embodiments the test sensor resonator setup further includes a second oscillator signal source that generates a second oscillation signal anti-phase to the first oscillation signal, coupled to a second controllable resistor that provides a controlled resistance R2 that simulates the selectable sensor resonator loss factor Rs. The first and second anti-phase oscillator signal sources and controlled resistances R1 and R2 are configured to generate differential first and second oscillation voltage signals at differential first and second inputs to the DUT resonant sensor circuit, and the DUT resonant sensor circuit is configured to generate, in response to the differential first and second oscillation voltage signals, the negative resistance −Ra that substantially counterbalances the resistances R1 and R2. The DUT resonant sensor circuit can be configured to generate the negative resistance −Ra by controlling the average amplitude of the differential first and second oscillation voltage signals.

In other example embodiments, where the DUT resonant sensor circuit is configured for single-ended input, and a boundary condition R1<−Ra is used for stability, or where the DUT resonant sensor circuit is configured for differential input, a boundary condition (2*R1=2*R2)<−Ra is used for stability. In other example embodiments, where the DUT resonant sensor circuit is configured for single-ended input, the test sensor resonator setup further includes a first series coupling capacitor between the first controllable resistor and the first input to the DUT resonant sensor circuit, configured with an AC impedance that is substantially less than R1−Ra, or where the DUT resonant sensor circuit is configured for differential input, the test sensor resonator setup further includes first and second series coupling capacitors between respectively the first and second controllable resistors, and the differential first and second inputs to the DUT resonant sensor circuit, both configured with an AC impedance that is substantially less than 2*R1−Ra.

FIG. 1 illustrates an example embodiment of a resonant inductive sensor 100, including an LC sensor resonator 110 and an IDC (resonant sensor) circuit 120. Sensor resonator 110 includes a coil inductor L, and is characterized by a loss factor Rs, or an equivalent parallel resistance/impedance $Rp=L/(C*Rs)$ that includes the LC impedance (which is frequency dependent).

In an example system application, sensor 100 can be used for proximity/position sensing of a conductive target. A proximate conductive target (within the sensing range of sensor 100) will cause a change in resonator impedance (loss factor Rp), which is detected by IDC 120.

IDC 120 drives resonator 110 with an AC excitation current synchronized with the oscillation frequency of the resonator. IDC 120 establishes a negative impedance control loop that drives resonator 110 with a negative impedance to maintain sustained resonator oscillation.

The example IDC resonator sensor circuit 120 includes a negative impedance stage 121 and a loop control stage 123. Negative impedance stage 121, interfaced to sensor resonator 110, drives resonator excitation current Idrv1/Idrv2 with a loop-controlled negative impedance, synchronized with differential resonator oscillation voltages Vin1/Vin2 (coil inductor inputs). Loop control stage 123 monitors average resonator oscillation amplitude (115), and provides a feedback loop control signal 129 that controls negative impedance to maintain sustained resonator oscillation (corresponding to a substantially constant average resonator oscillation amplitude).

That is, the example IDC resonant sensor circuit 120 establishes a negative impedance control loop (121/123) that monitors average resonator oscillation amplitude based on differential resonator oscillation voltage inputs (Vin1/Vin2), and drives the sensor resonator (Idrv1/Idrv2) with a controlled negative impedance (129) to maintain a substantially constant average resonator oscillation amplitude. The controlled negative impedance balances resonator impedance (Rp loss factor) for sustained resonator oscillation. While the example IDC resonant sensor circuit is configured to receive differential resonator oscillation input voltages Vin1/Vin2 from the coil inductor, and to generate a negative impedance by controlling average resonator oscillation amplitude, the Disclosed test system and methodology are applicable to other resonant sensor circuit configurations that are single-ended and/or generate negative impedance by means other than controlling average resonator oscillation amplitude.

IDC 120 outputs sensor response data corresponding to the loop control signal 129 (1/Rp) that controls negative impedance. Sensor response data quantifies changes in negative impedance corresponding to changes in resonator impedance (Rp), such as resulting from a proximate conductive target.

Figure 2:
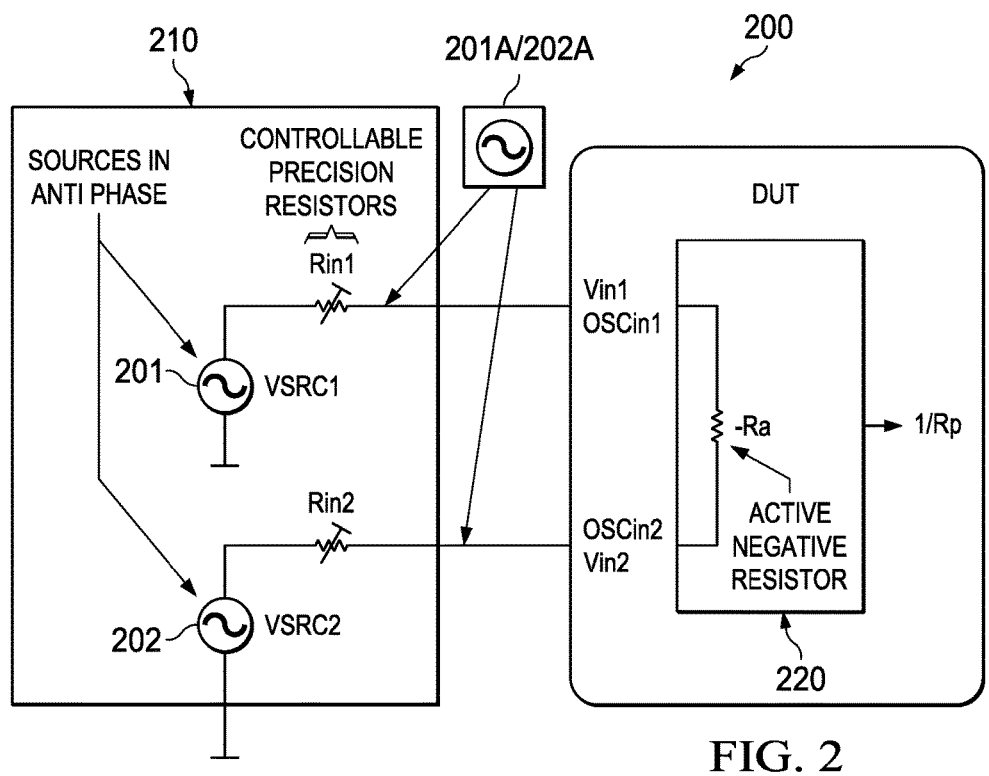
FIG. 2 illustrates an example embodiment of a test system for testing resonant sensor circuits (such as the IDC in FIG. 1), including an example test sensor resonator setup 210, and a DUT resonant sensor circuit 220, where the example test resonator setup 210 simulates a sensor resonator using precision anti-phase signal sources 201 and 202 (VSRC1 and VSRC2), and precision controllable resistors Rin1 and Rin2 that simulate the sensor resonator impedance/loss factor (controlled to simulate changes in sensor resonator impedance/loss factor such as in response to a conductive target).

FIG. 2 illustrates an example embodiment of system suitable for testing resonant sensor circuits, such as the example IDC circuit in FIG. 1. An example test system 200 includes a test sensor resonator setup 210, and a device-under-test (DUT) resonant sensor circuit 220.

The example test sensor resonator setup 210 simulates a sensor resonator, such as sensor resonator 110 in FIG. 1 (LC tank circuit including a resonator loss factor Rs). Test sensor resonator setup 210 uses precision signal sources 201 and 202 (VSRC1 and VSRC2), and precision controllable resistors Rin1 and Rin2 to simulate the operation and response of a sensor resonator. Signal sources 201/202 VSRC1/VSRC2 are operated anti-phase. Resistors Rin1/Rin2 are controlled to simulate changes in resonator resistance Rs (simulating changes in Rp) which cause a corresponding change in negative impedance generated by the DUT IDC 220.

Precision signal sources and precision resistors are readily available. In particular, precision metal film resistors are readily available that has less than 5 ppm/degree C. temperature drift and an absolute accuracy of 0.01%.

The example DUT resonant sensor circuit 220 is the IDC 120 in FIG. 1. DUT IDC 220 is represented as an active negative resistance (impedance) −Ra. That is, with reference to FIG. 1, operating in a resonant inductive sensing system, IDC 120 monitors resonator oscillation voltage (Vin1/Vin2) from resonator 110, and drives resonator 110 (Idrv1/Idrv2) with a negative resistance to maintain a substantially constant average resonator oscillation amplitude (corresponding to sustained resonator oscillation).

In the example test system 200, DUT IDC 220 is configured for analog signal capture. Test sensor resonator setup 210 simulates a sensor resonator by supplying precision differential oscillation voltages VSRC1 and VSRC2, which are input through controlled resistors Rin1. and Ring to DUT IDC 220. DUT IDC 220 responds by generating negative resistance −Ra to control differential resonator oscillation voltages OSC1/OSC2 at the differential inputs to the DUT IDC, corresponding to maintaining a substantially constant average resonator oscillation amplitude. DUT IDC 220 outputs sensor response data corresponding to 1/Rp, which corresponds to the negative resistance −Ra required to counterbalance the resonator resistance simulated by Rin1/Rin2.

In the context of the IDC sensor resonator circuit 110 in FIG. 1, the negative resistance −Ra generated by negative resistance stage 121 is controlled by loop control stage 123 based on average resonator oscillation amplitude 115 to maintain average resonator oscillation amplitude substantially constant (corresponding to sustained resonator oscillation). Average resonator oscillation amplitude changes in response to changes in resonator impedance Rp, such as in response to a conductive target.

Test setup 210 simulates the sensor LC resonator, including changes in resonator impedance Rp, such as resulting from operation with a target. Anti-phase (differential) driving signals provided by signal sources 201/202 VSRC1/VSRC2 are amplified by the resistive divider formed by controllable resistors Rin1/Rin2, and the active negative resistance −Ra of the DUT IDC 220. The amplified driving signals 201A/202A provide differential inputs to DUT IDC 220, which are controlled by operation of the DUT IDC in generating an active negative impedance −Ra (corresponding to controlling average resonator oscillation amplitude).

Precision signal sources 201/202 operated anti-phase simulate a sensor resonator operating at resonance. Precision resistors Rin1/Rin2 are controlled to simulate a change in resonator loss factor (Rs in FIG. 1) in response to a target.

DUT IDC 220 responds by controlling differential oscillation voltage inputs OSCin1/OSCin2 by controlling negative resistance −Ra to counterbalance Rin1/Rin2 (which simulate resonator resistance Rs), so that the average oscillation amplitude OSCin1/OSCin2 observed at the input of the IDC is kept constant. That is, DUT IDC 220 generates a negative resistance −Ra in response to the simulated resonator resistance Rin1/Rin2.

The negative impedance −Ra is converted by DUT IDC 220 into sensor response data samples −1/Ra=1/Rp output by the DUT IDC.

Signal sources VSRC1/VSRC2 and controllable resistors Rin1/Rin2 are chosen so that the resulting resonator/resonance impedance simulated by Rin1/Rin2 is within the negative impedance range −Ra of the DUT IDC 220. The simulated resonance impedance is given by:

$$Rp=(Rin1+Rin2)*VOSC/(VOSC+VSRC)$$

where VOSC is the differential oscillation voltage VOSCin1−VOSCin2 that is kept substantially constant by DUT IDC 220, and VSRC is the differential voltage generated by signal sources VSRC1 and VSRC2. A boundary condition of 2*Rin<−Ra can be used to ensure stable operation.

If the DUT input common mode level is not well defined, series coupling capacitors can be added at the inputs OSCin1/OSCin2. For example, the coupling capacitors can have an AC impedance substantially less than 2*Rin−Ra so that it can operate at any common mode level.

The test system and methodology for resonant sensor circuits (sensor electronics) using precision signal sources and controllable resistors has been described for an example test system in FIG. 2, which can be used with the example DUT IDC (resonant sensor circuit) of FIG. 1. As noted above, while the example IDC resonant sensor circuit is configured to receive differential resonator oscillation input voltages Vin1/Vin2 from a coil inductor, and to generate a negative impedance by controlling average resonator oscillation amplitude (OSCin1/OSCin2), the Disclosed test system and methodology are applicable to other resonant sensor circuit configurations, such as configurations that are single-ended, and/or generate negative impedance by means other than controlling average resonator oscillation amplitude. For single-ended configurations, a boundary condition of Rin<−Ra can be used to ensure stable operation, and a series coupling capacitor can be used with an AC impedance substantially less than Rin<−Ra for operation at any common mode level.

Advantages of the test setup/methodology for resonant sensor circuits include: eliminating variations between test sites by eliminating the requirement for autonomous resonators; high precision (since precision signal sources, and precision resistors are readily available); eliminating startup time of the resonator; synchronizing test system measurement, e.g. the oscillation signal is synchronized with signal capturing by the test instruments; and eliminating interlocking risk between multiple simultaneous test setups.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and The inventiom claimed is:

1. A test system suitable for testing a resonant sensor circuit operable with a sensor resonator characterized by a loss factor Rs, the resonant sensor circuit to monitor resonator oscillation voltage, and to drive the sensor resonator with a negative resistance controlled to sustain resonator oscillation, comprising:
a test sensor resonator setup to simulate a sensor resonator with a selectable loss factor Rs, and including
a first oscillator signal source to generate a first oscillation signal, coupled to
a first controllable resistor to provide a controlled resistance R1 to simulate a selectable sensor resonator loss factor Rs,
the first oscillator signal source and the first controllable resistor to generate a first oscillation voltage signal based on the controlled resistance R1;
a device-under-test (DUT) resonant sensor circuit:
coupled to receive the first oscillation voltage signal at a first input; and
to generate, in response to the first oscillation voltage signal, a negative resistance −Ra that substantially counterbalances the resistance R1 corresponding to a state of sustained oscillation at the first input.

2. The system of claim 1, wherein:
the test sensor resonator setup further includes:
a second oscillator signal source to generate a second oscillation signal anti-phase to the first oscillation signal, coupled to
a second controllable resistor to provide a controlled resistance R2 that simulates the selectable sensor resonator loss factor Rs;
the first and second anti-phase oscillator signal sources and controlled resistances R1 and R2 to generate differential first and second oscillation voltage signals at differential first and second inputs to the DUT resonant sensor circuit; and
the DUT resonant sensor circuit to generate, in response to the differential first and second oscillation voltage signals, the negative resistance −Ra that substantially counterbalances the resistances R1 and R2.

3. The system of claim 1, wherein the DUT resonant sensor circuit is configured for single-ended input, and wherein a boundary condition R1<−Ra is used for stability.

4. The system of claim 2, wherein a boundary condition (2*R1=2*R2)<−Ra is used for stability.

5. The system of claim 1, wherein the test sensor resonator setup further includes a first series coupling capacitor between the first controllable resistor and the first input to the DUT resonant sensor circuit to provide an AC impedance that is substantially less than R1−Ra.

6. The system of claim 2, wherein the test sensor resonator setup further includes first and second series coupling capacitors between respectively the first and second controllable resistors, and the differential first and second inputs to the DUT resonant sensor circuit, to provide an AC impedance that is substantially less than 2*R1−Ra.

7. The system of claim 1, wherein the DUT resonant sensor circuit comprises:
a resonant inductive sensor circuit operable with a sensor LC resonator; and
the DUT resonant sensor circuit to generate the negative resistance −Ra by controlling the average amplitude of the first oscillation voltage signal.

8. A method suitable for testing a resonant sensor circuit operable with a sensor resonator characterized by a loss factor Rs, the resonant sensor circuit to monitor resonator oscillation voltage, and to drive the sensor resonator with a negative resistance controlled to sustain resonator oscillation, comprising:
generating a first oscillation voltage signal with a first oscillator signal source, coupled to a first controllable resistor that provides a controlled resistance R1 that simulates a selectable sensor resonator loss factor Rs;
thereby simulating a sensor resonator with a selectable loss factor Rs;
receiving the first oscillation voltage signal at a first input to a device-under-test (DUT) resonant sensor circuit; and
operating the DUT resonant sensor circuit to generate, in response to the first oscillation voltage signal, a negative resistance −Ra that substantially counterbalances the resistance R1 corresponding to a state of sustained oscillation at the first input to the DUT resonant sensor circuit.

9. The method of claim 8:
further comprising generating a second oscillation voltage signal with a second oscillator signal source that is anti-phase to the first oscillation signal source, and a second controllable resistor that provides a controlled resistance R2 that simulates the selectable sensor resonator loss factor Rs;
the first and second anti-phase oscillator signal sources and controlled resistances R1 and R2 generating differential first and second oscillation voltage signals at differential first and second inputs to the DUT resonant sensor circuit; and
the DUT resonant sensor circuit generating, in response to the differential first and second oscillation voltage signals, the negative resistance −Ra that substantially counterbalances the resistances R1 and R2.

10. The method of claim 8, wherein the DUT resonant sensor circuit is configured for single-ended input, and wherein a boundary condition R1<−Ra is used for stability.

11. The method of claim 9, wherein a boundary condition (2*R1=2*R2)<−Ra is used for stability.

12. The method of claim 8, further including a first series coupling capacitor between the first controllable resistor and the first input to the DUT resonant sensor circuit to provide an AC impedance that is substantially less than R1−Ra.

13. The method of claim 9, further including first and second series coupling capacitors between respectively the first and second controllable resistors, and the differential first and second inputs to the DUT resonant sensor circuit, to provide an AC impedance that is substantially less than 2*R1−Ra.

14. The method of claim 8, wherein the DUT resonant sensor circuit is a resonant inductive sensor circuit operable with a sensor LC resonator, to generate the negative resistance −Ra by controlling the average amplitude of the first oscillation voltage signal.

15. A test system suitable for testing a resonant sensor circuit operable with a sensor resonator characterized by a loss factor Rs, the resonant sensor circuit to monitor resonator oscillation voltage, and to drive the sensor resonator with a negative resistance controlled to sustain resonator oscillation, comprising:

a test sensor resonator setup to simulate a sensor resonator with a selectable loss factor Rs, and including
  a first oscillator signal source to generate a first oscillation signal, coupled to a first controllable resistor to provide a controlled resistance R1 that simulates a selectable sensor resonator loss factor Rs,
  a second oscillator signal source to generate a second oscillation signal anti-phase to the first oscillation signal, coupled to a second controllable resistor to provide a controlled resistance R2 that simulates the selectable sensor resonator loss factor Rs;
the first and second anti-phase oscillator signal sources and controlled resistances R1 and R2 to generate differential first and second oscillation voltage signals at differential first and second inputs to the DUT resonant sensor circuit; and
a device-under-test (DUT) resonant sensor circuit:
  coupled to receive the differential first and second oscillation voltage signal at differential first and second inputs; and
  to generate a negative resistance −Ra to control the average amplitude of the differential first and second oscillation voltage signals to substantial counterbalance the first and second resistances R1 and R2 corresponding to a state of sustained oscillation at the differential first and second inputs.

16. The system of claim 15, wherein a boundary condition (2*R1=2*R2)<−Ra is used for stability.

17. The system of claim 15, wherein the test sensor resonator setup further includes first and second series coupling capacitors between respectively the first and second controllable resistors, and the differential first and second inputs to the DUT resonant sensor circuit to provide an AC impedance that is substantially less than 2*R1−Ra.

18. The system of claim 15, wherein the DUT resonant sensor circuit is a resonant inductive sensor circuit operable with a sensor LC resonator.

* * * * *